(12) United States Patent
Steegen et al.

(10) Patent No.: US 7,923,786 B2
(45) Date of Patent: *Apr. 12, 2011

(54) SELECTIVE SILICON-ON-INSULATOR ISOLATION STRUCTURE AND METHOD

(75) Inventors: An L. Steegen, Stamford, CT (US); Maheswaran Surendra, Croton-on-Hudson, NY (US); Hsing-Jen Wann, Fishkill, NY (US); Ying Zhang, Yorktown Heights, NY (US); Franz Zach, Wappingers Falls, NY (US); Robert Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 496 days.

This patent is subject to a terminal disclaimer.

(21) Appl. No.: 11/871,249

(22) Filed: Oct. 12, 2007

(65) Prior Publication Data

US 2008/0029818 A1 Feb. 7, 2008

Related U.S. Application Data

(60) Continuation of application No. 11/082,993, filed on Mar. 17, 2005, now Pat. No. 7,326,983, which is a division of application No. 10/604,102, filed on Jun. 26, 2003, now Pat. No. 6,936,522.

(51) Int. Cl.
*H01L 21/70* (2006.01)

(52) U.S. Cl. ........ 257/369; 257/371; 257/374; 257/347; 257/E21.564

(58) Field of Classification Search ................. 257/369, 257/E21.564, 371, 374
See application file for complete search history.

(56) References Cited

U.S. PATENT DOCUMENTS

| | | | |
|---|---|---|---|
| 4,264,382 A | 4/1981 | Anantha et al. |
| 4,497,107 A | 2/1985 | Cogan |
| 4,683,637 A | 8/1987 | Varker et al. |
| 4,778,775 A | 10/1988 | Tzeng |
| 4,849,376 A | 7/1989 | Balzan et al. |
| 4,888,300 A | 12/1989 | Burton |
| 4,925,805 A | 5/1990 | van Ommen et al. |
| 5,015,594 A | 5/1991 | Chu et al. |
| 5,153,813 A | 10/1992 | Oehrlein et al. |
| 5,227,658 A | 7/1993 | Beyer et al. |
| 5,232,866 A | 8/1993 | Beyer et al. |
| 5,427,975 A | 6/1995 | Sparks et al. |
| 5,583,368 A | 12/1996 | Kenney |
| 5,955,767 A | 9/1999 | Liu et al. |
| 5,972,758 A | 10/1999 | Liang |
| 6,144,086 A | 11/2000 | Brown et al. |
| 6,229,187 B1 | 5/2001 | Ju |
| 6,245,636 B1 | 6/2001 | Maszara |
| 6,323,092 B1 | 11/2001 | Lee |
| 6,350,659 B1 | 2/2002 | Liu et al. |
| 6,355,962 B1 | 3/2002 | Liang et al. |

(Continued)

*Primary Examiner* — Kenneth A Parker
*Assistant Examiner* — Jose R Diaz
(74) *Attorney, Agent, or Firm* — Schmeiser, Olsen & Watts; Wenjie Li

(57) ABSTRACT

A first aspect of the present invention is a method of forming an isolation structure including: (a) providing a semiconductor substrate; (b) forming a buried N-doped region in the substrate; (c) forming a vertical trench in the substrate, the trench extending into the N-doped region; (d) removing the N-doped region to form a lateral trench communicating with and extending perpendicular to the vertical trench; and (e) at least partially filling the lateral trench and filling the vertical trench with one or more insulating materials.

17 Claims, 14 Drawing Sheets

U.S. PATENT DOCUMENTS

| | | | |
|---|---|---|---|
| 6,376,286 B1 * | 4/2002 | Ju | 438/149 |
| 6,429,091 B1 | 8/2002 | Chen et al. | |
| 6,437,405 B2 * | 8/2002 | Kim | 257/347 |
| 6,465,852 B1 | 10/2002 | Ju | |
| 6,476,445 B1 | 11/2002 | Brown et al. | |
| 6,680,243 B1 | 1/2004 | Kamath et al. | |
| 6,787,423 B1 * | 9/2004 | Xiang | 438/296 |
| 6,936,522 B2 | 8/2005 | Steegen et al. | |
| 7,326,983 B2 * | 2/2008 | Steegen et al. | 257/296 |
| 2002/0185469 A1 | 12/2002 | Podlesnik et al. | |

* cited by examiner

US 7,923,786 B2

SELECTIVE SILICON-ON-INSULATOR ISOLATION STRUCTURE AND METHOD

This application is a continuation of U.S. patent application Ser. No. 11/082,993 filed Mar. 17, 2005 now U.S. Pat. No. 7,326,983, which is a division of U.S. patent application Ser. No. 10/604,102 filed on Jun. 26, 2003 and now U.S. Pat. No. 6,936,522 issued on Aug. 30, 2005.

FIELD OF THE INVENTION

The present invention relates to the field of semiconductor structure and fabrication; more specifically, it relates to a selective silicon-on-insulator (SSOI or $S^2OI$) isolation structure and the method of fabricating the selective silicon-on-insulator isolation structure.

BACKGROUND OF THE INVENTION

The integrated circuit performance advantages silicon-on-insulator (SOI) technology over bulk silicon technology include reduced latch-up, reduced parasitic junction capacitance and reduced short channel effects. On the other hand, SOI technology suffers from floating body effects as well as dopant uniformity effects, especially in fully depleted devices. For large wafer diameters, SOI substrates are difficult to fabricate and expensive. No cost effective method of combining the integrated circuit performance characteristics of SOI and bulk silicon technology exists in the industry.

SUMMARY OF THE INVENTION

A first aspect of the present invention is a method of forming an isolation structure comprising: (a) providing a semiconductor substrate; (b) forming a buried N-doped region in the substrate; (c) forming a vertical trench in the substrate, the trench extending into the N-doped region; (d) removing the N-doped region to form a lateral trench communicating with and extending perpendicular to the vertical trench; and (e) at least partially filling the lateral trench and filling the vertical trench with one or more insulating materials.

A second aspect of the present invention is a method of forming an isolation structure comprising: (a) forming a first patterned masking layer on a semiconductor substrate, whereby a portion of the substrate is exposed through an opening in the first masking layer; (b) implanting ions into the exposed portion of the substrate thereby forming a buried N-doped region in the substrate; (c) removing said first patterned masking layer and forming a second patterned masking layer on the substrate, an opening in the second masking layer aligning over a less than whole portion of the buried N-doped region; (d) etching a vertical trench in the substrate through the opening in the masking layer, the trench extending into the N-doped region; (e) laterally etching the N-doped region to form a lateral trench communicating with and extending perpendicular to the vertical trench; and (f) at least partially filling the lateral trench and filling vertical trench with one or more insulating materials.

A third aspect of the present invention is a semiconductor device comprising: a semiconductor substrate having a top surface; a first region of the substrate having a first N-well, a first P-well or both a first N-well and a first P-well extending into the semiconductor substrate from the top surface and bounded in a direction perpendicular to the top surface by a first vertical trench isolation extending perpendicular to the top surface, the source and drain of a first NFET, a first PFET or both a first NFET and a first PFET formed respectively in the first P-well or the first N-well of the first region; and a second region of the substrate having a second N-well, a second P-well or both a second N-well and a second P-well, a lateral trench isolation extending laterally in a direction parallel to the top surface into the second N-well, the second P-well or both the second N-well and the second P-well from a second vertical trench isolation, the second vertical trench isolation extending perpendicular to the top surface, the source and drain of a second NFET, a second PFET or both a second NFET and a second PFET formed respectively in the second P-well or the second N-well of the second region.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
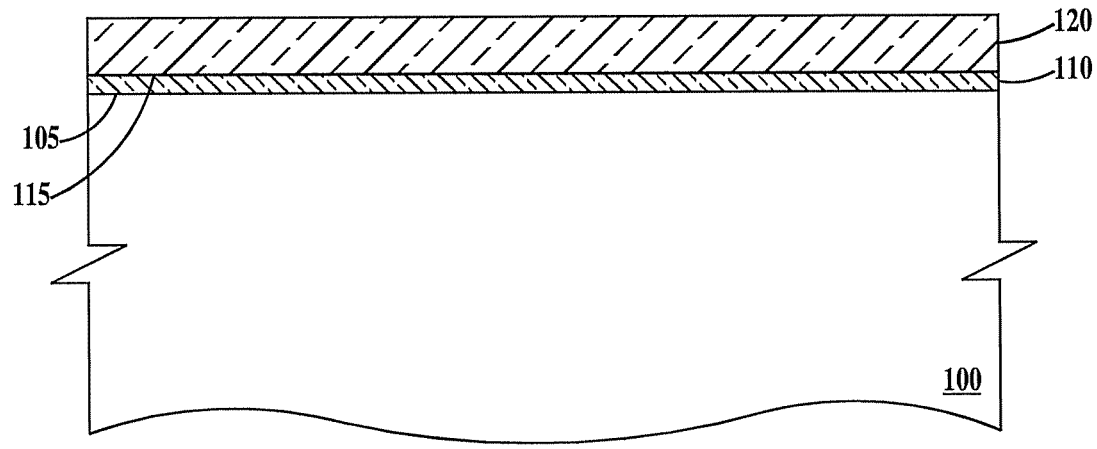
FIGS. 1A through 1H are partial cross-sectional views illustrating a first embodiment for formation of a SSOI trench according to the present invention.

FIGS. 1A through 1H are partial cross-sectional views illustrating a first embodiment for formation of a SSOI trench according to the present invention. In FIG. 1A, a substrate 100 having a top surface 105 is illustrated. In a first example, substrate 100 is a monocrystalline (bulk) silicon substrate lightly doped P type (e.g. 1E17 atm/cm$^3$). In a second example, substrate 100 is a substrate having at least a monocrystalline silicon layer extending to top surface 105. A first dielectric layer 110 having a top surface 115 is formed on top surface 105 of substrate 100. A second dielectric layer 120 is formed on a top surface 115 of second dielectric layer 110. In one example, first dielectric layer 110 is a thermal oxide having a thickness of about 40 to 100 Å and second dielectric layer 120 is silicon nitride having a thickness of about 900 to 1200 Å.

Figure 1B:
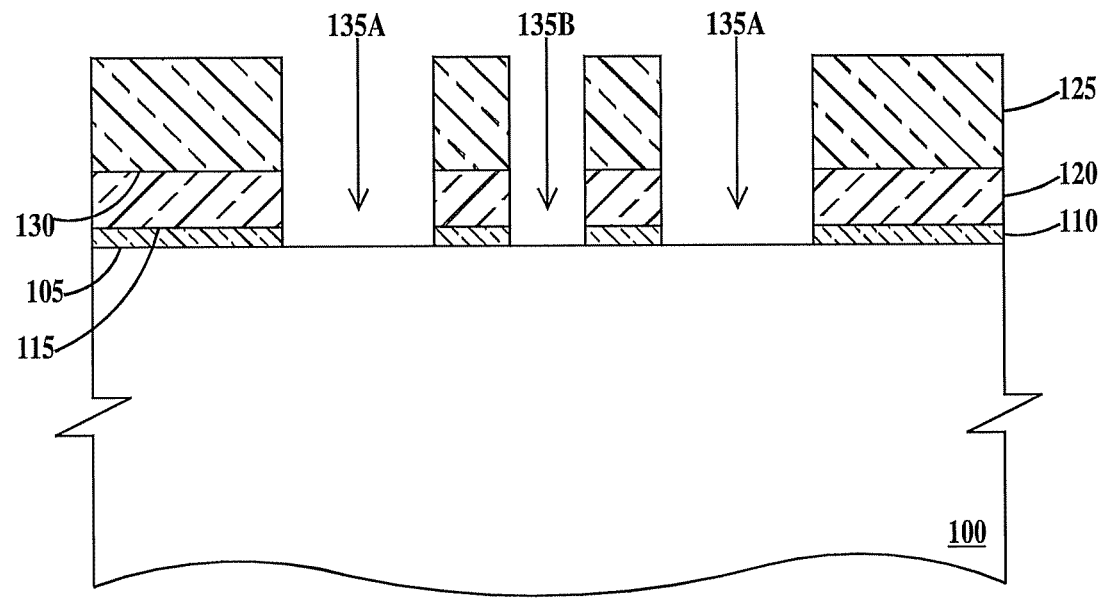

In FIG. 1B, a patterned photoresist layer 125 has been formed by well-known micro-photolithographic techniques on a top surface 130 of second dielectric layer 120. Patterned photoresist layer 125 acts as a mask for the formation of trenches 135A and 135B in first and second dielectric layers 110 and 120. Top surface 105 of substrate 100 are exposed in the bottom of trenches 135A and 135B. In the example of first dielectric layer 110 being thermal oxide and second dielectric layer 120 being silicon nitride, trenches 135A and 135B may be formed by any number of well known plasma etch processes for etching silicon nitride selective to thermal oxide followed by a wet etch of thermal oxide in an hydrofluoric acid (HF) containing etchant.

Figure 1C:
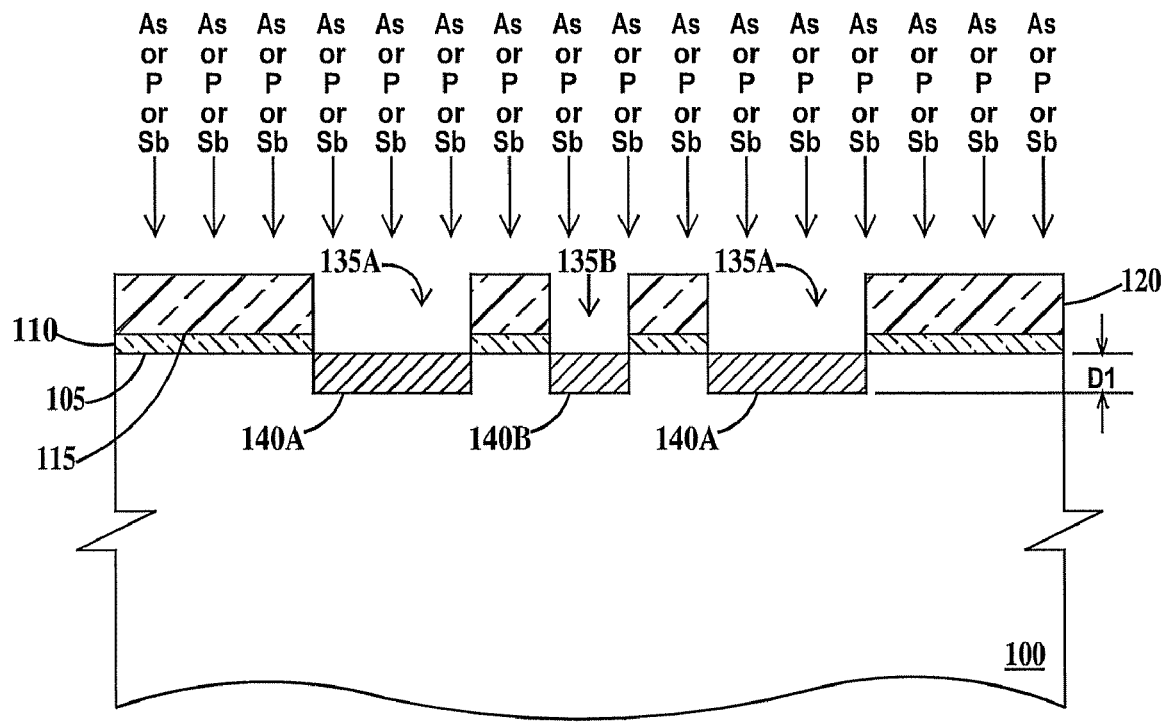

In FIG. 1C, patterned photoresist layer 125 of FIG. 1B is removed and an N type ion implantation performed using the now patterned first and second dielectric layers 110 and 120 as ion implantation masks in order to form N-doped region 140A and 140B in substrate 100. In one example, arsenic (As), phosphorus (P), antimony (Sb) ions or combinations thereof are implanted at energies of about 1 Kev to 10 Kev and doses of about $1E14$ atm/cm$^2$ to $1E16$ atm/cm$^2$. However, any species that dopes silicon N type may be used. A rapid thermal anneal (RTA) of 950° C. to 1050° C. is performed in order to activate the species in N-doped regions 140A and 140B. N-doped regions 140A and 140B extend a distance D1 from top surface 105 of substrate 100 into the substrate. In one example, D1 is about 300 to 1000 Å. N-doped regions 140A and 140B may also be formed by other dopant techniques such as solid state diffusion from a doping layer or a vapor.

Figure 1D:
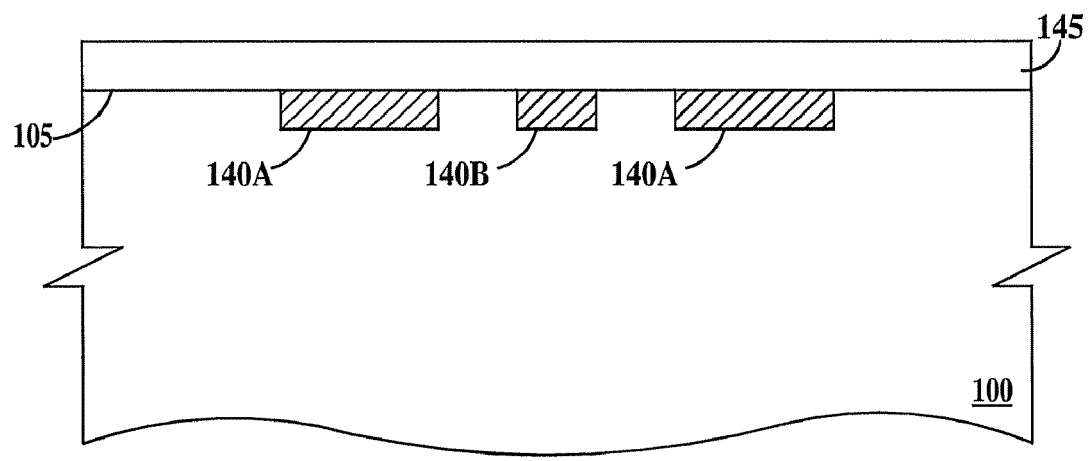

In FIG. 1D, first and second dielectric layers 110 and 120 of FIG. 1C are removed and an epitaxial silicon layer 145 is grown on top surface 105 of substrate 100. While not illustrated for clarity, N-doped regions 140A and 140B may slightly extend into epitaxial silicon layer 145. An epitaxial layer of silicon is a layer having the same crystal structure and crystal plane orientation as the silicon substrate it is grown on. In one example, epitaxial layer 145 is 750 to 1250 Å thick and is undoped.

Figure 1E:
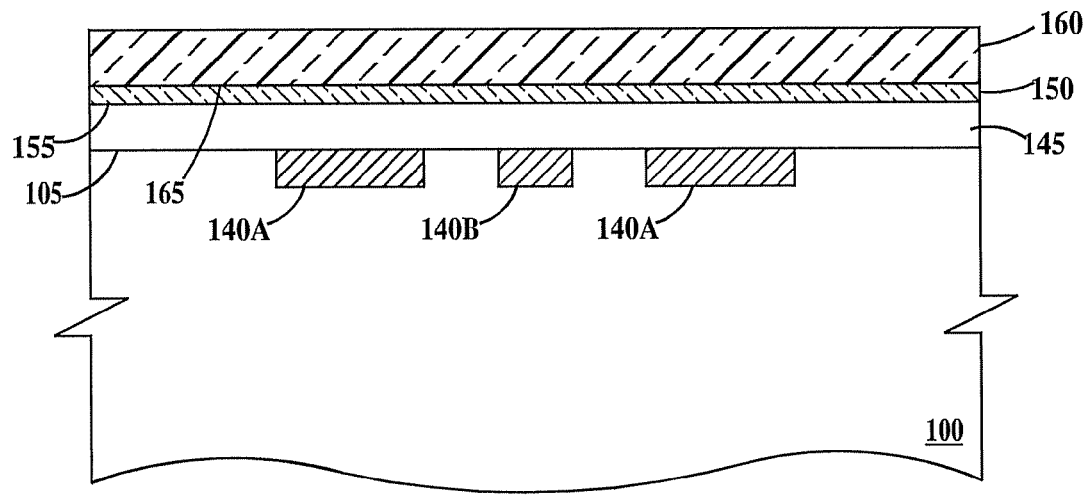

In FIG. 1E, a first dielectric layer 150 is formed on a top surface 155 of epitaxial layer 145 and a second dielectric layer 160 is formed on a top surface 165 of the first dielectric layer. In one example, first dielectric layer 150 is a thermal oxide having a thickness of about 40 to 100 Å and second dielectric layer 160 is silicon nitride having a thickness of about 900 to 1200 Å.

Figure 1F:
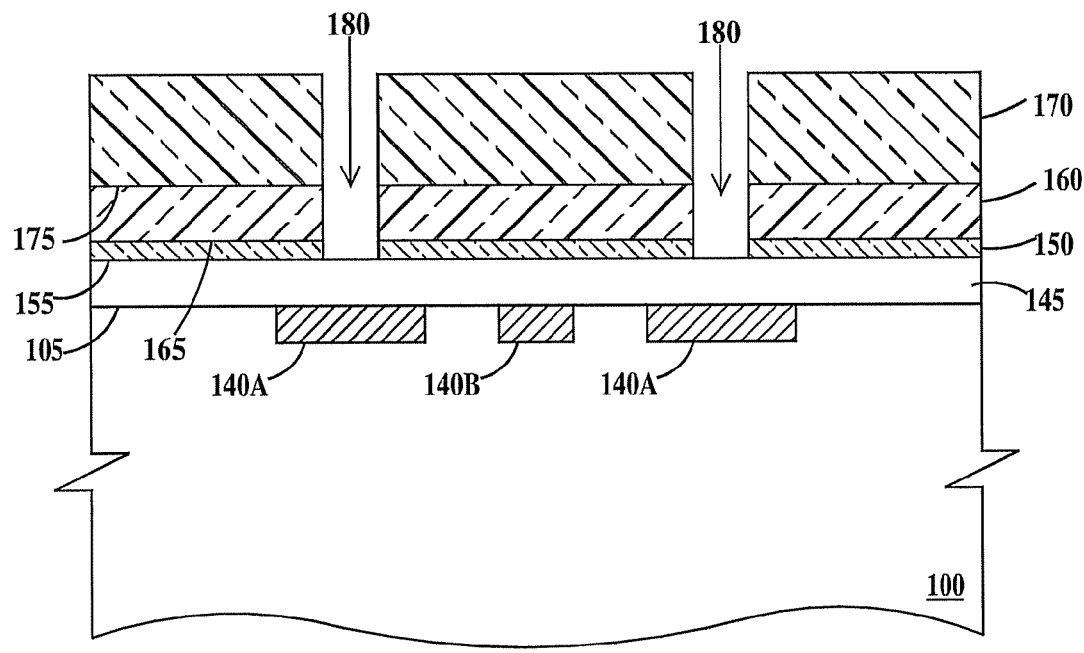
Figure 1G:
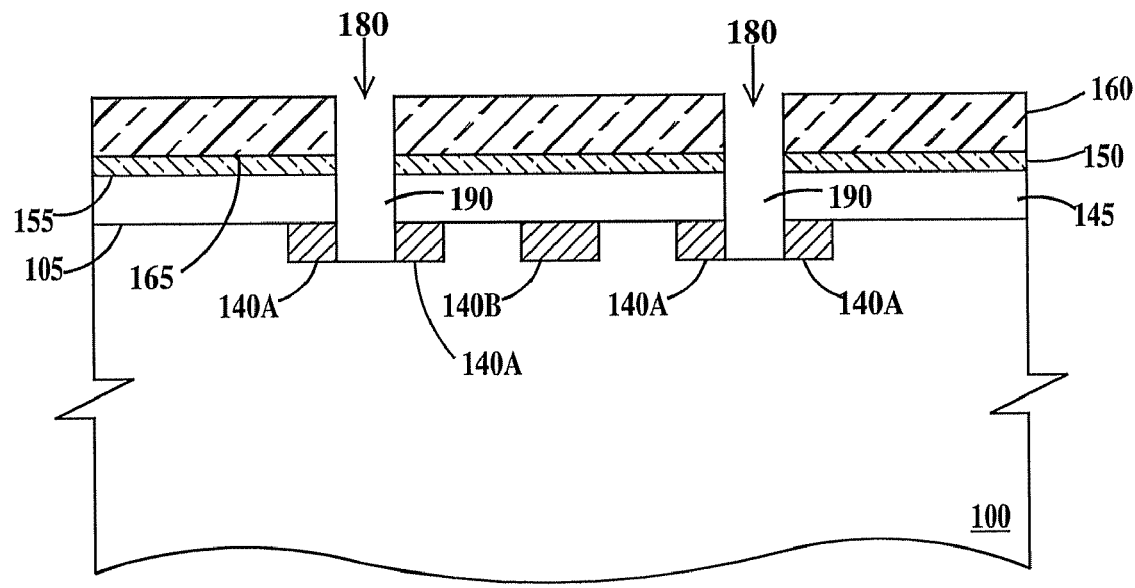
Figure 1H:
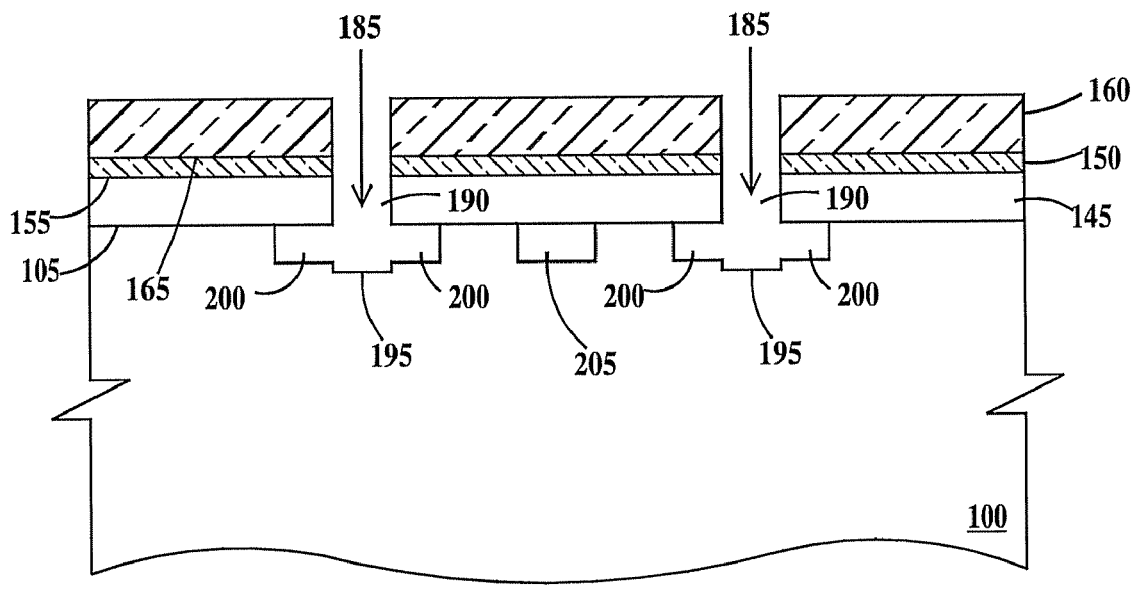

In FIG. 1F, a patterned photoresist layer 170 is formed by well-known micro-photolithographic techniques on a top surface 175 of second dielectric layer 160. Patterned photoresist layer 170 acts as a mask for the formation of trenches 180 in first and second dielectric layers 150 and 160. Top surface 155 of epitaxial silicon layer 145 is exposed in the bottom of trenches 180. In the example of first dielectric layer 150 being thermal oxide and second dielectric layer 160 being silicon nitride, trenches 180 may be formed by any number of well known plasma etch processes for etching silicon nitride selective to thermal oxide followed by a wet etch of thermal oxide in an hydrofluoric acid (HF) containing etchant. Trenches 180 are aligned over N-doped regions 140A. In FIGS. 1G and 1H, SSOI trenches 185 are formed in epitaxial silicon layer 145 and substrate 100 by multi-step plasma etch process described infra.

As illustrated in FIG. 1H, SSOI trenches 185 include vertical trench portions 190, having a bottom surface 195, formed in epitaxial silicon layer 145 and substrate 100. Vertical trench portions 190 are perpendicular to top surface 105 of substrate 100 and top surface 155 of epitaxial silicon layer 145. SSOI trenches 185 further include lateral trench portions 200 extending parallel to top surface 105 of substrate 100. Bottom surface 195 of vertical trench portion 190 extends below lateral trench portions 200.

Turning to the formation of SSOI trenches 185, first, in FIG. 1G, patterned photoresist layer 170 (see FIG. 1F) is removed and vertical trench portions 190 of SSOI trenches 185 are etched through epitaxial layer 145 until at least N-doped regions 140A are exposed in the bottom of the trench. In the example of FIG. 1G, all the N-doped material is removed from vertical trench portion 190. Vertical trench portion 190 may also be etched part way into N-doped regions 140A. Then in FIG. 1H, lateral trench portions 200 are etched and vertical trench portion 190 is extended a predetermined distance to form bottom surface 195. Lateral trench portions 200 are formed by selective etching of N-doped regions 140A of FIG. 1G as described infra. A lateral trench portion 205 is also illustrated in FIG. 1H. Lateral trench portion 205 is part of an SSOI trench not in the plane of the drawing. The three-dimensional geometry possible for SSOI isolation is illustrated more clearly in FIGS. 5, 6A and 6B and described infra.

The multi-step plasma etch process used to form SSOI trenches 185, utilizes a plasma etch process that is highly selective undoped or lightly P-doped silicon to N-doped silicon. There are essentially four steps. In the first step, any residual oxide remaining on the top surface 155 of epitaxial layer 145 in the bottom of trenches 180 (see FIG. 1G) is removed using fluorine, chlorine and/or bromine based plasma chemistries with high RF bias. In the second step, vertical portions 190 of SSOI trenches 185 are etched using fluorine, chlorine and/or bromine based plasma chemistries containing a small quantity of oxygen. In the third step, lateral portions 200 (and 205) of trenches 185 are etched in a process that the selectively of N-doped silicon to undoped (or slightly P-doped silicon) can be as high as 500:1 using chlorine and/or bromine based plasma chemistries at high pressures. In the fourth step, vertical portion 190 of trench 185 is further etched to a predetermined depth using fluorine, chlorine and/or bromine based plasma chemistries containing a small quantity of oxygen. An example of a plasma etch tool capable of performing the processes listed supra is a 9400 inductively coupled plasma source (ICP) plasma etch tool manufactured by LAM Research Corp. of Fremont Calif. In an ICP tool two RF power sources are used, an upper (for generating a plasma) and a lower (for maintaining etch bias). Other ICP systems such as those manufactured by Applied Materials, Santa Clara, Calif., or Tokyo Electron Limited, Tokyo, Japan, may also be used.

FIGS. 2A through 2D are partial cross-sectional views illustrating a second embodiment for formation of a SSOI trenches according to the present invention. The second embodiment for formation of a SSOI trenches is similar to the first embodiment for formation of a SSOI trenches with the major difference being the elimination of the need to form an epitaxial silicon layer.

Figure 2A:
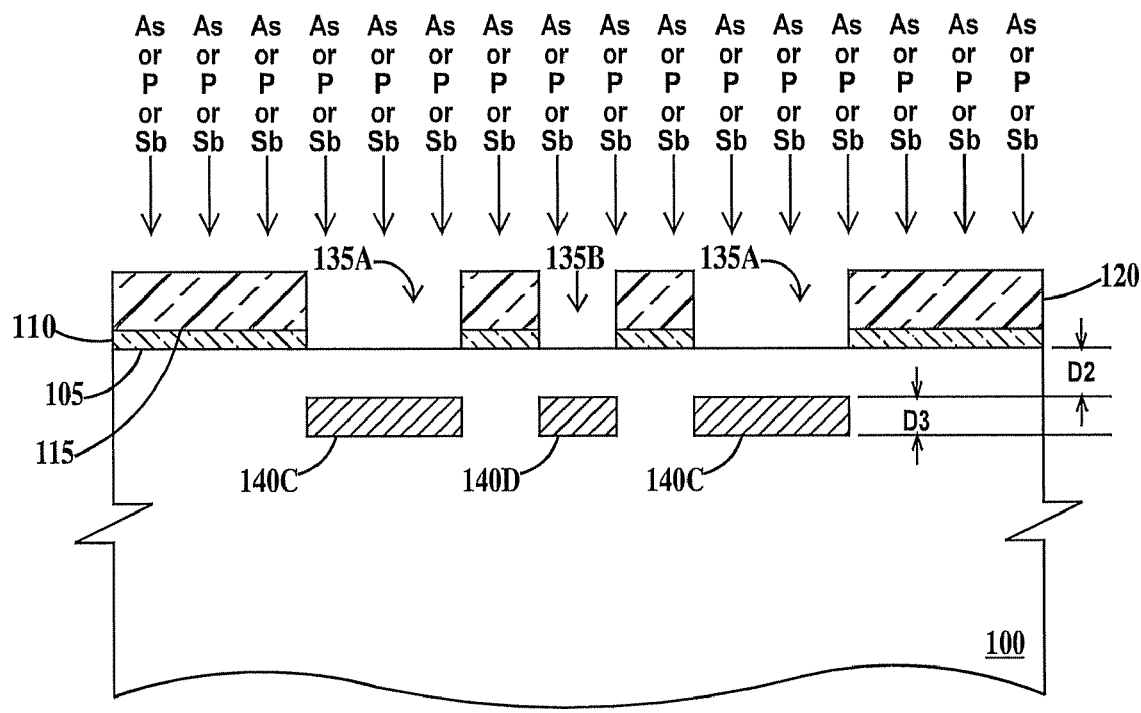
FIGS. 2A through 2D are partial cross-sectional views illustrating a second embodiment for formation of SSOI trenches according to the present invention.

FIG. 2A is similar to FIG. 1C. In FIG. 2A, the patterned first and second dielectric layers 110 and 120 are ion implantation masks for defining N-doped regions 140C and 140D in substrate 100. In one example, As, P, Sb ions or combinations thereof are implanted at energies of about 150 Kev to 400 Kev and doses of about $1E14$ atm/cm$^2$ to $1E16$ atm/cm$^2$. However, any species that dopes silicon N type may be used. A rapid thermal anneal (RTA) of 950° C. to 1050° C. is performed in order to activate the species in N-doped regions 140C and 140D. N-doped regions 140C and 140D are buried a distance D2 from top surface 105 of substrate 100 into the substrate and have a vertical depth D3. In one example, D2 is about 750 to 1250 Å and D3 is about 300 to 1000 Å.

Figure 2B:
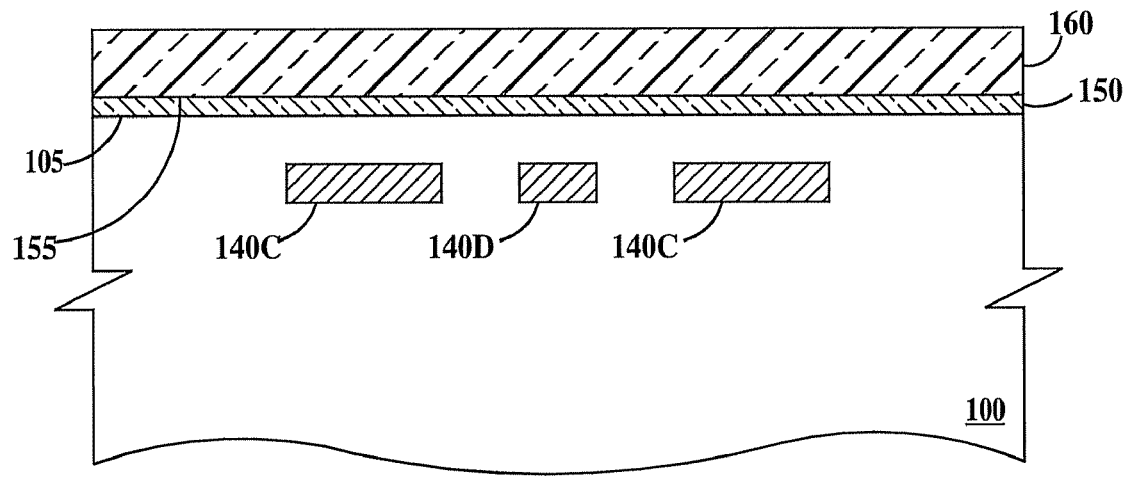

FIG. 2B is similar to FIG. 1E. In FIG. 2B, first and second dielectric layers 110 and 120 of FIG. 2A are removed and first dielectric layer 150 is formed on top surface 105 of substrate 100 and second dielectric layer 160 is formed on top surface 165 of the first dielectric layer. In one example, first dielectric layer 150 is a thermal oxide having a thickness of about 40 to 100 Å and second dielectric layer 160 is silicon nitride having a thickness of about 900 to 1200 Å.

Figure 2C:
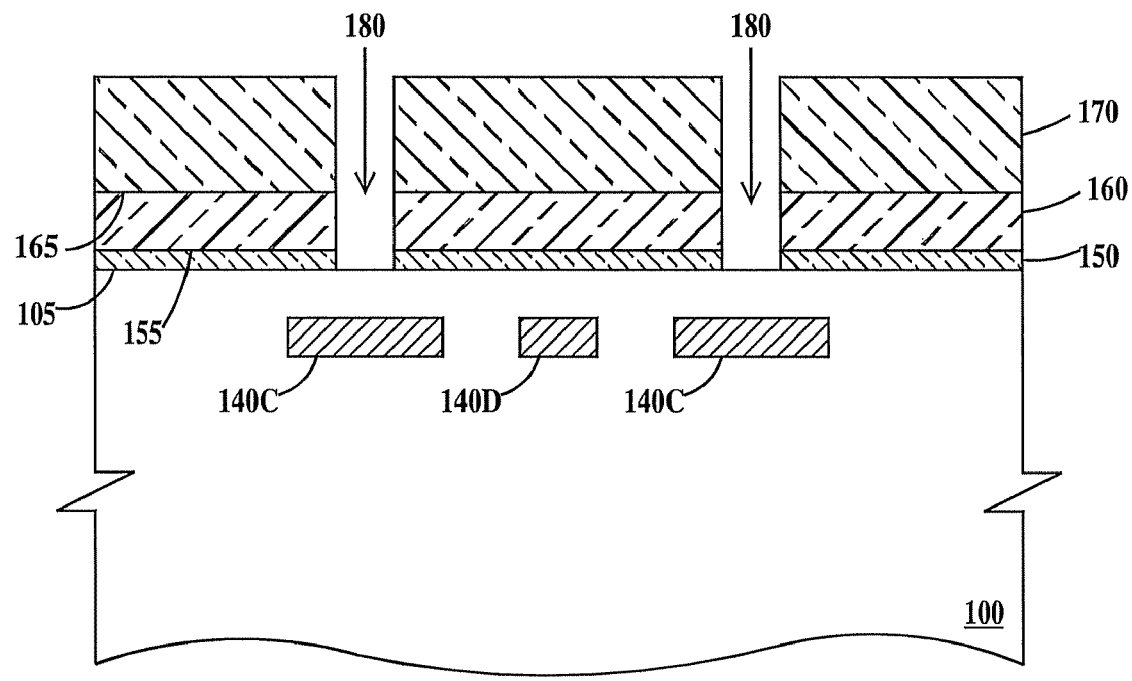

FIG. 2C is similar to FIG. 1F. In FIG. 2C, patterned photoresist layer 170 is formed by well-known micro-photolithographic techniques on top surface 165 of second dielectric layer 160. Patterned photoresist layer 170 acts as a mask for the formation of trenches 180 in first and second dielectric layers 150 and 160. Top surface 105 of substrate 100 is exposed in the bottom of trenches 180. In the example of first dielectric layer 150 being thermal oxide and second dielectric layer 160 being silicon nitride, trenches 180 may be formed by any number of well known plasma etch processes for etching silicon nitride selective to thermal oxide followed by a wet etch of thermal oxide in an hydrofluoric acid (HF) containing etchant. Trenches 180 are aligned over N-doped regions 140C.

Figure 2D:
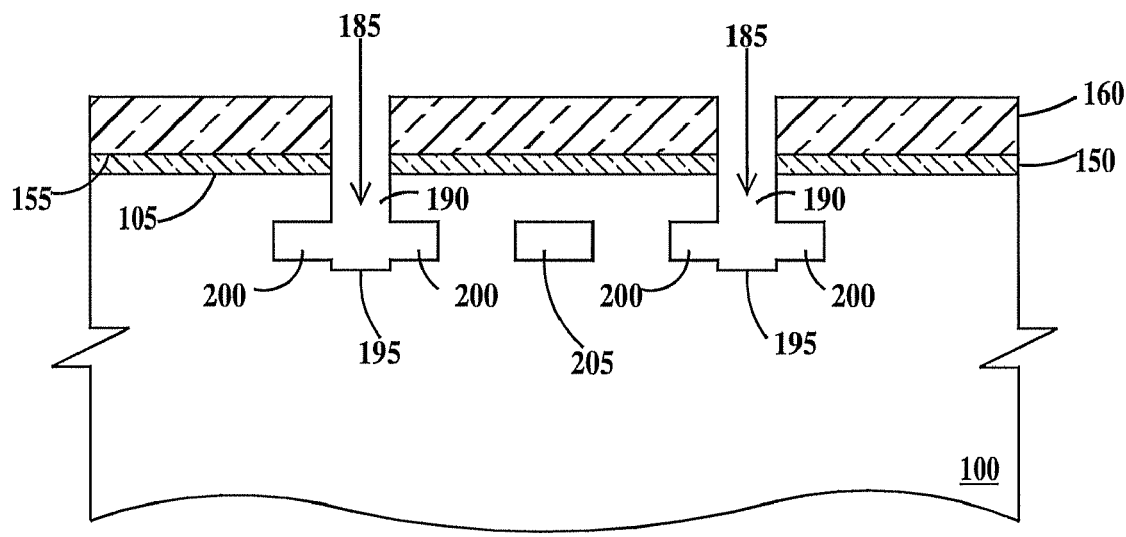

FIG. 2D is similar to FIG. 1H. In FIG. 1G, patterned photoresist layer 170 of FIG. 2C is removed and SSOI trenches 185 are formed in substrate 100 by the multi-step plasma etch process described supra. SSOI trenches 185 include vertical trench portions 190, having a bottom 195, formed in substrate 100. Vertical trench portions 190 are perpendicular to top surface 105 of substrate 100. SSOI trenches 185 further include lateral trench portions 200 extending parallel to top surface 105 of substrate 100. Bottom 195 of vertical trench portion 190 extends below lateral trench portions 200. Lateral trench portions 200 are formed by selective etching of N-doped regions 140A of FIG. 2C as described supra.

Figure 3A:
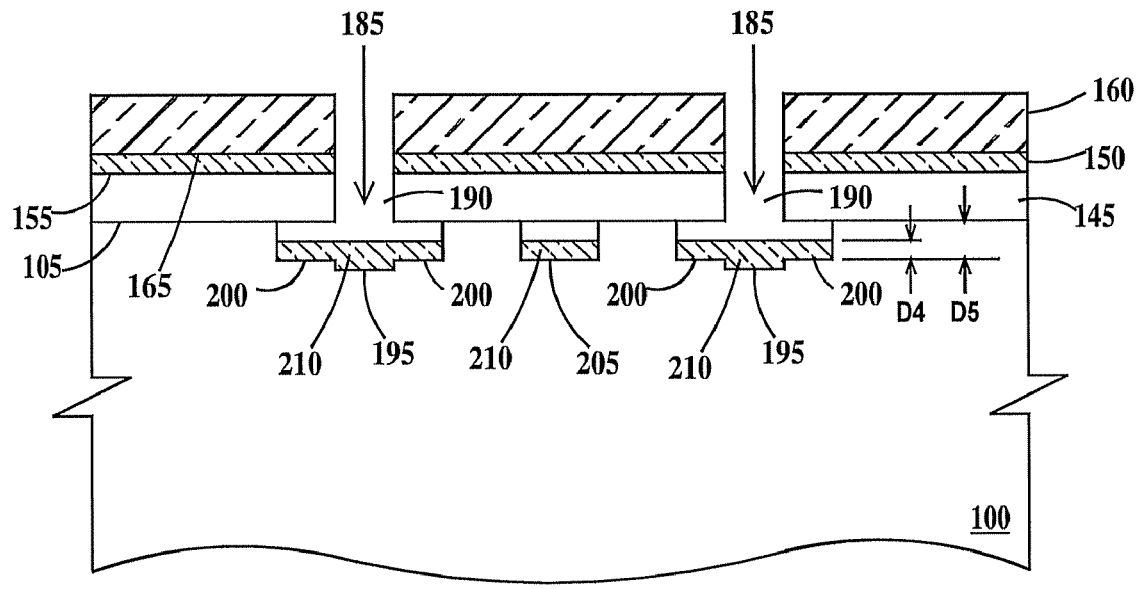
FIGS. 3A through 3E are partial cross-sectional views illustrating a first embodiment for filling of SSOI trenches with an insulating material according to the present invention.
Figure 3B:
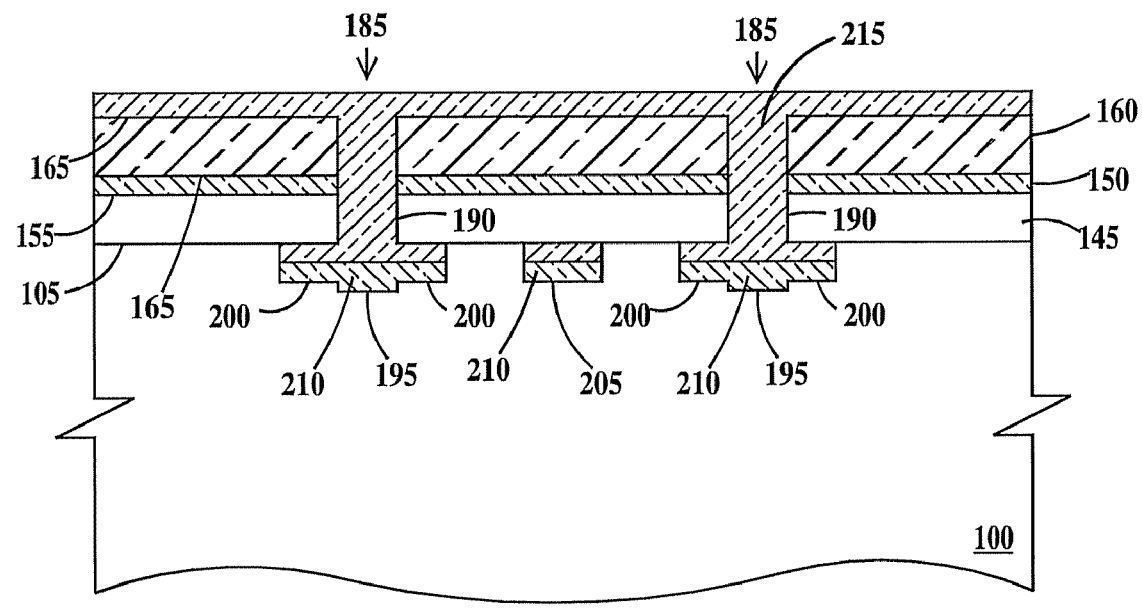

FIGS. 3A through 3E are partial cross-sectional views illustrating a first embodiment for filling of SSOI trenches with an insulating material according to the present invention. While the SSOI trench fill processes illustrated in FIGS. 3A through 3EC are illustrated with SSOI trenches formed by the first or epitaxial method of forming SSOI trenches, the processes illustrated and described infra are applicable to the second, non-epitaxial, method of forming SSOI trenches illustrated in FIGS. 2A through 2D and described supra. In FIG. 3A, SSOI trenches 185 are partially filled with a first insulator 210. In one example, first insulator 210 is a high temperature resistant spin-on-glass. After spin-on application, the material is annealed at about 700° C. to 1000° C. in an inert or steam atmosphere. The thickness of first insulator 210 after anneal is D4 and the vertical thickness of lateral trench portions 200 is D5. In one example, the ratio of D4/D5 is about 0.5. In FIG. 3B, SSOI trenches 185 are overfilled with a second insulator 215. In one example, second insulator 215 is also high temperature resistant spin-on-glass which is also annealed at about 700° C. to 1000° C. in an inert or steam atmosphere. The two-step fill process and reduces the amount of stress in the completed SSOI structure. The two-step fill process may be controlled to include or not include a void area in the upper region of lateral trench portions 200.

Figure 3C:
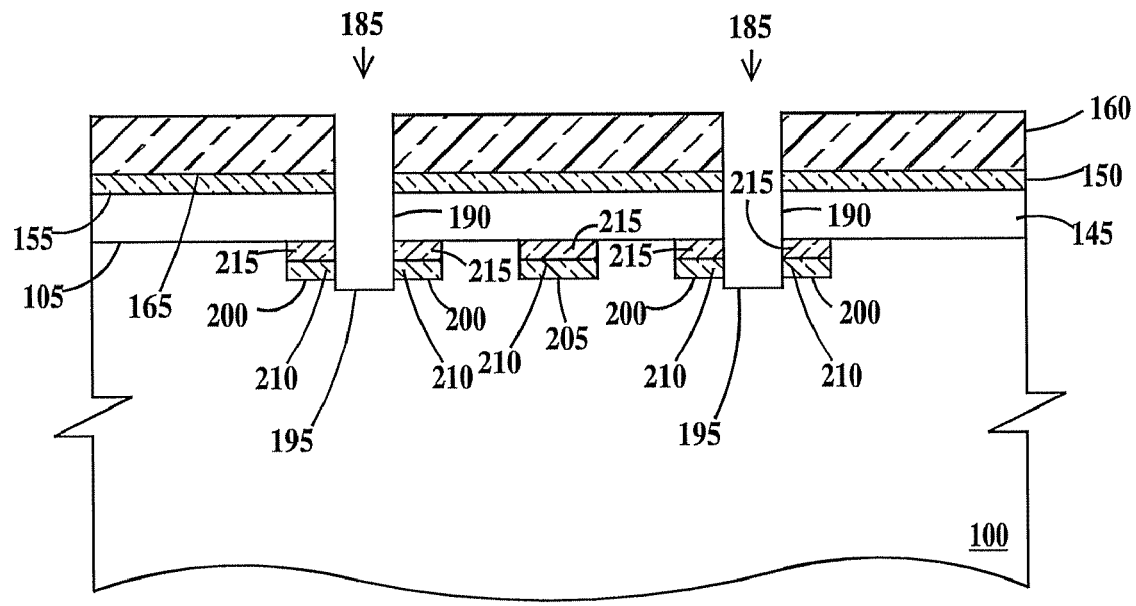
Figure 3D:
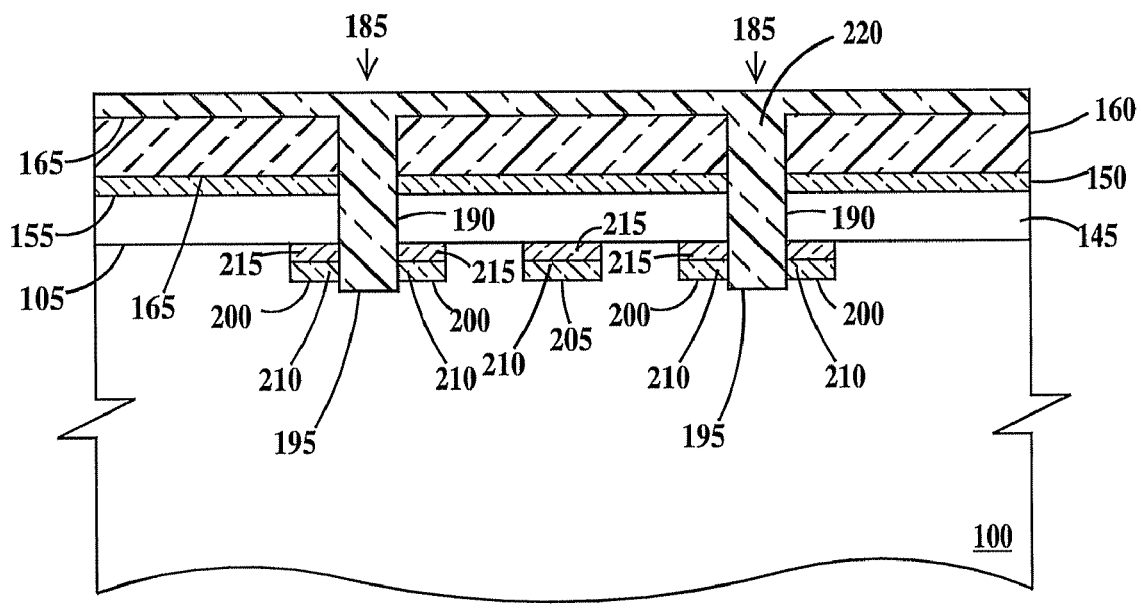
Figure 3E:
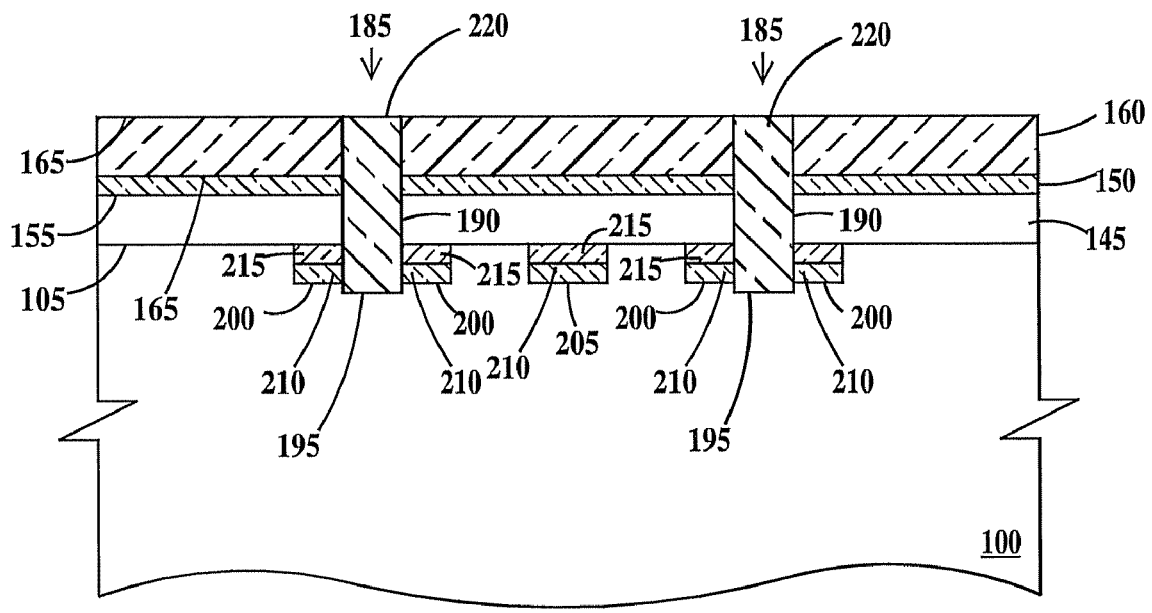

In FIG. 3C, both first and second insulating layers 210 and 215 are removed from vertical trench portion 190 of SSOI trenches 185 by a plasma etch process. First and second insulating layers 210 and 215 are not removed from lateral trench portions 200 of SSOI trenches 185. In FIG. 3D vertical trench portion 190 of SSOI trench 185 is overfilled with a third insulator 220. In one example, third insulator 220 is high-density plasma (HDP) oxide. In FIG. 3E, a chemical-mechanical-polish (CMP) step is performed in order to remove third insulator 220 from top surface 165 of second dielectric layer 160. Second dielectric layer 160 is used as a CMP etch stop layer. The fill process is completed by about a 30 to 60 minute at about 700° C. to 1000° C. anneal in an inert atmosphere.

Figure 4A:
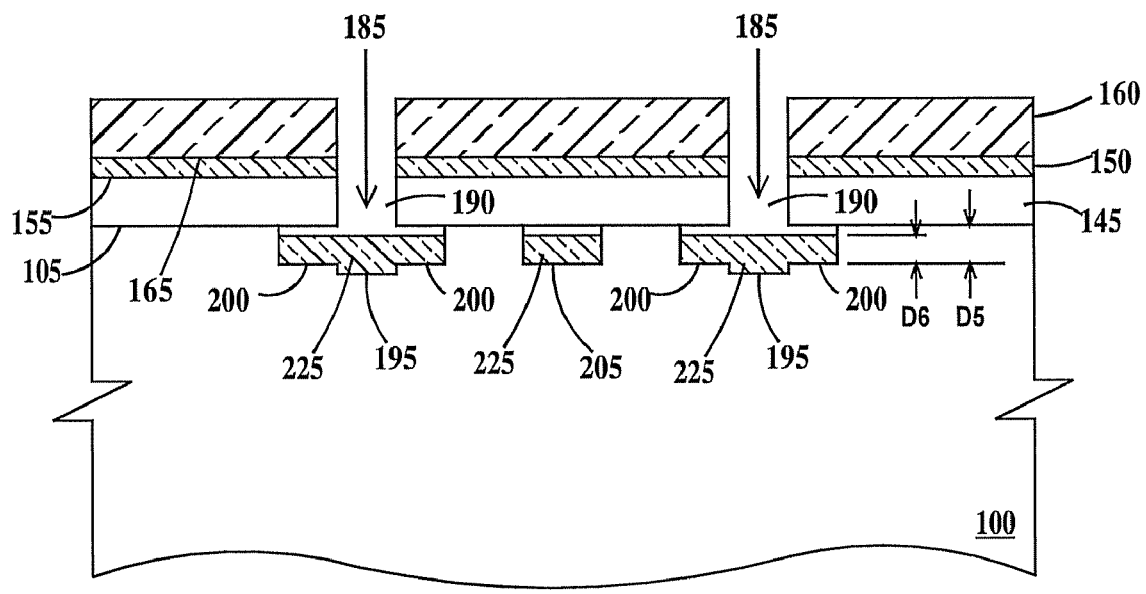
FIGS. 4A through 4C are partial cross-sectional views illustrating a second embodiment for filling of SSOI trenches with an insulating material according to the present invention.
Figure 4B:
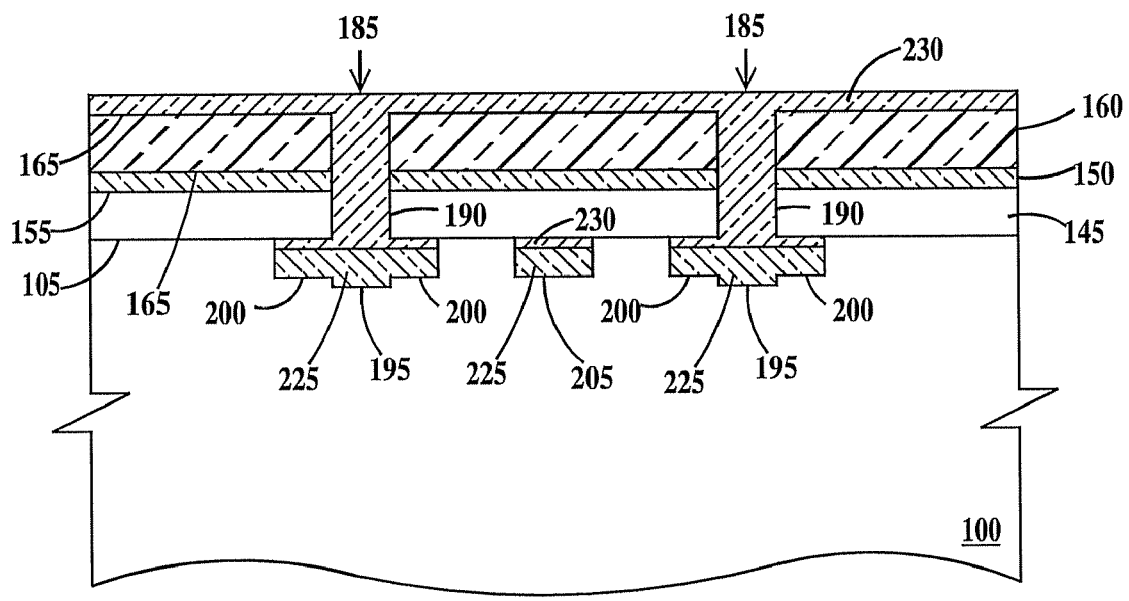
Figure 4C:
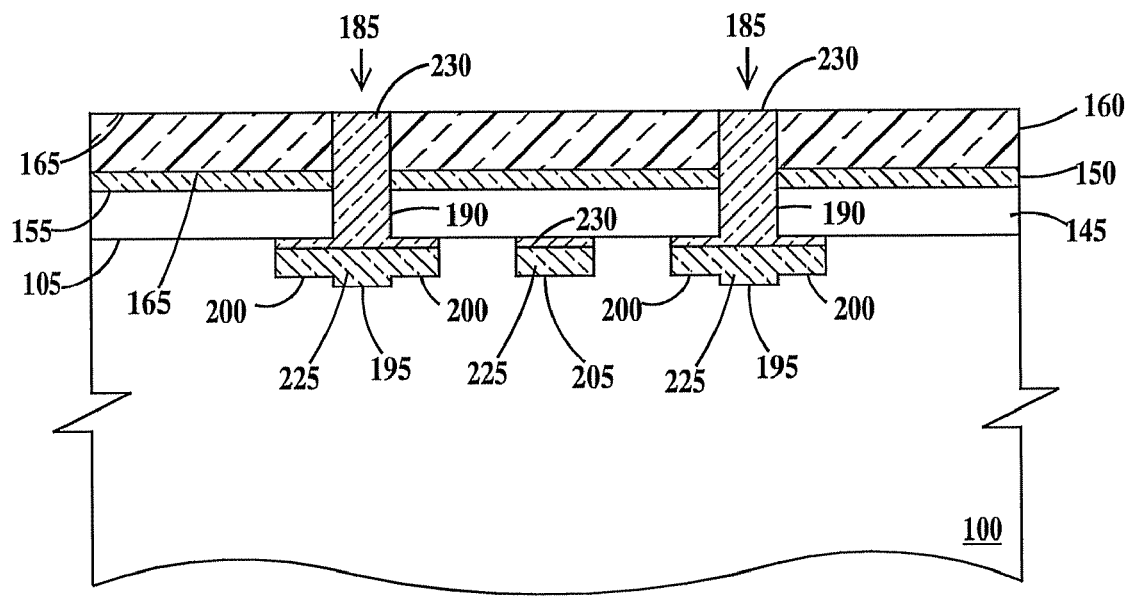

FIGS. 4A through 4C are partial cross-sectional views illustrating a second embodiment for filling of SSOI trenches with an insulating material according to the present invention. While the SSOI trench fill processes illustrated in FIGS. 4A through 4C are illustrated with SSOI trenches formed by the first or epitaxial method of forming SSOI trenches, the processes illustrated and described infra are applicable to the second, non-epitaxial, method of forming SSOI trenches illustrated in FIGS. 2A through 2D and described supra.

In FIG. 4A, SSOI trenches 185 are partially filled with a first insulator 225. In one example, first insulator 225 is a tetraethoxysilane (TEOS) chemical-vapor-deposition CVD oxide. The thickness of first insulator 225 is D5 and the vertical thickness of lateral trench portions 200 is D6. In one example, the ratio of D6/D5 is about 0.7 to 0.9. In FIG. 4B, SSOI trenches 185 are overfilled with a second insulator 230. In one example, second insulator 230 is HDP oxide. Then about a 30 to 60 minute at about 700° C. to 1000° C. anneal in an inert atmosphere e is performed. The two-step fill process and reduces the amount of stress in the completed SSOI structure. The two-step fill process may be controlled to include or not include a void area in the upper region of lateral trench portions 200. In FIG. 4C, a chemical-mechanical-polish (CMP) step is performed in order to remove second insulator 230 from top surface 165 of second dielectric layer 160. Second dielectric layer 160 is used as a CMP etch stop layer.

Figure 5A:
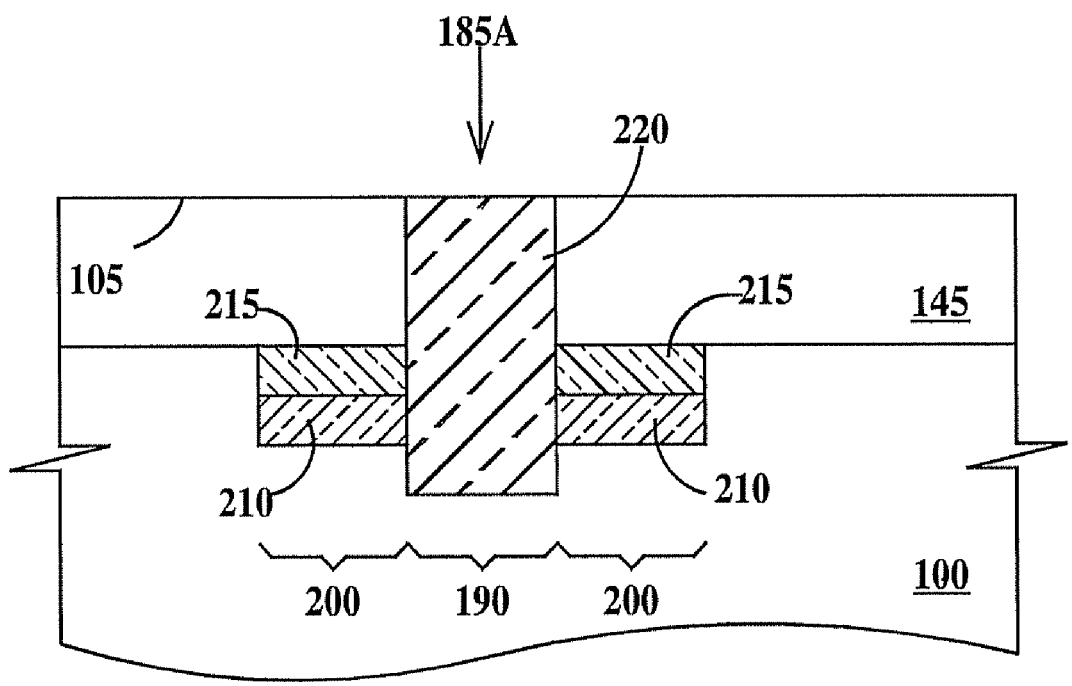
FIG. 5A is a partial cross-sectional view of a completed SSOI isolation structure according to the present invention.

FIG. 5A is a partial cross-sectional view of a completed SSOI isolation structure according to the present invention. In FIG. 5A, a completed SSOI isolation 185A is illustrated after removal of first and second dielectric layers 150 and 160 (see FIG. 3E). Though the fill of SSOI isolation 185A is that of the first fill embodiment illustrated in FIGS. 3A through 3E and described supra, the fill structure may be that of the second fill embodiment illustrated in FIGS. 4A through 4C and described supra may be substituted. Also, epitaxial layer 145 will not be present as if the SSOI trench was formed by the second embodiment of the present invention illustrated in FIGS. 2A through 2D and described supra.

Figure 5B:
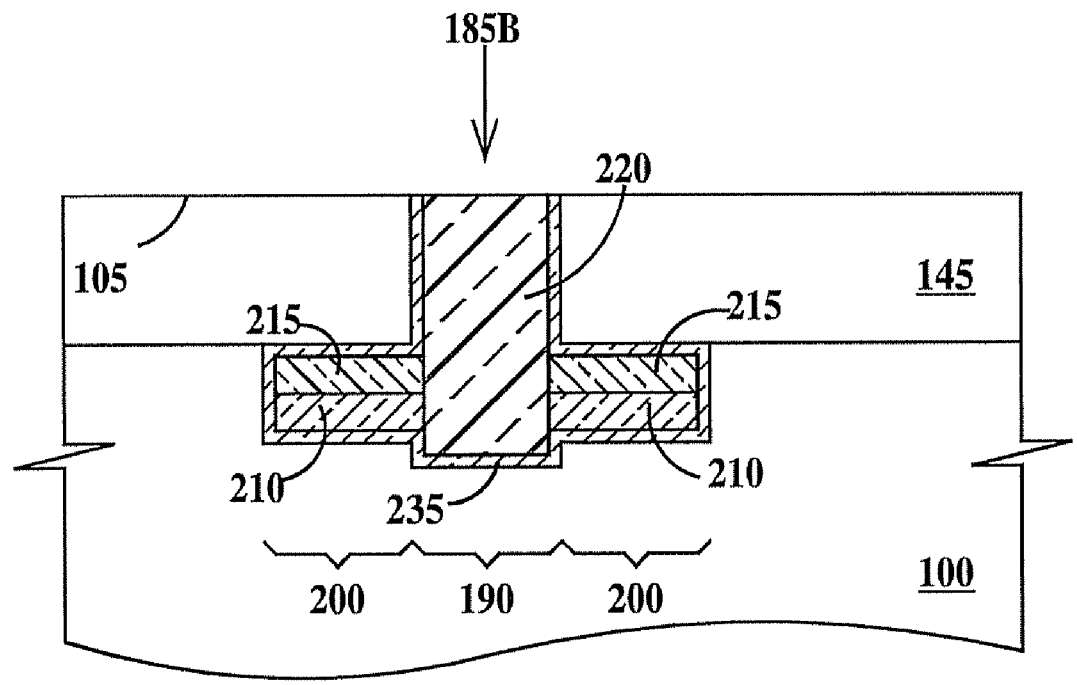
FIG. 5B is a partial cross-sectional view of an optional completed SSOI isolation structure according to the present invention.

FIG. 5B is a partial cross-sectional view of an optional completed SSOI isolation structure according to the present invention. In FIG. 5B, a completed SSOI isolation 185B is illustrated after removal of first and second dielectric layers 155 and 160 (see FIG. 3E). The only difference between SSOI isolation 185A of FIG. 5A and SSOI isolation 185B is the presence of a liner 235 between first insulator 210, second insulator 215 and third insulator 220 and silicon substrate 100 and epitaxial layer 145. Liner 235 is formed prior to the processes illustrated in FIG. 3A or 4A and described supra. In one example, liner 235 comprised of a first layer of rapid thermal oxidation (RTO) oxide formed on exposed silicon surfaces of the unfilled SSOI trenched coated with a conformal plasma-enhanced CVD (PECVD) silicon nitride layer. In one example, the RTO oxide is about 100 to 150 Å thick and the PECVD silicon nitride layer is about 50 to 80 Å thick.

Figure 6:
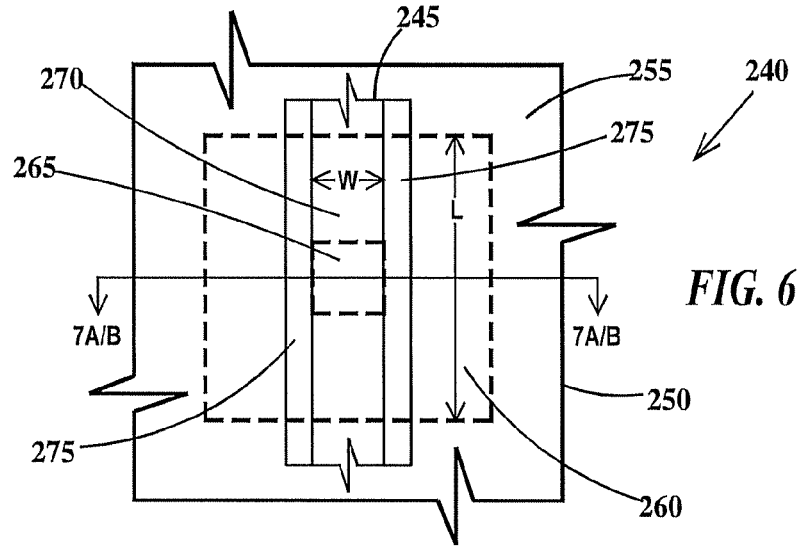
FIG. 6 is a partial top view of an SSOI device according to the present invention.

FIG. 6 is a partial top view of an SSOI device 240 according to the present invention. In FIG. 6, SSOI device 240 includes a metal-oxide-silicon (MOS) transistor 245 and SSOI isolation 250. SSOI isolation 250 includes a vertical portion 255 and a lateral portion 260. The extent of the lateral portion is defined by the dashed lines. Note there is an area 265 into which neither vertical portion 255 or lateral portion 260 of SSOI isolation 250 extends. MOS transistor 245 includes a gate electrode 270 flanked by spacers 275. In one example, gate electrode 270 is polysilicon. A portion of gate electrode 270 is aligned over area 265. MOS transistor 245 has a length "L" and a width "W".

Figure 7A:
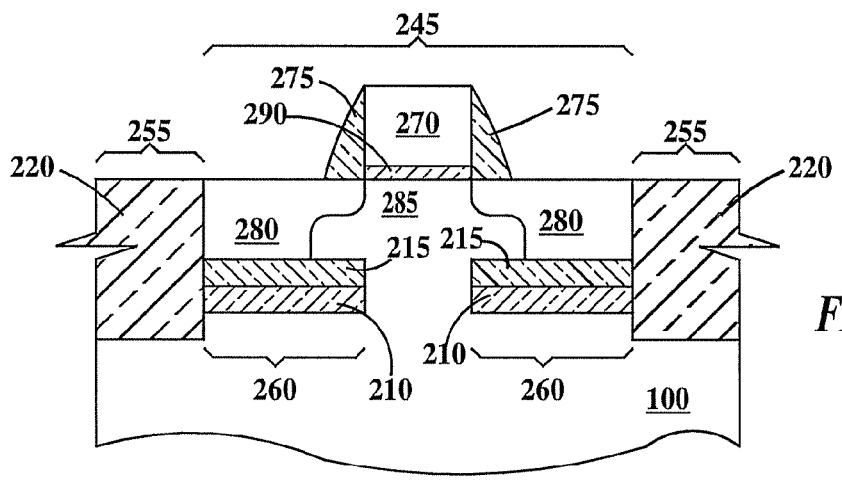
FIG. 7A is a partial cross-sectional view through line 7A/B of FIG. 6 illustrating an SSOI structure filled according to the processes illustrated in FIGS. 3A through 3E.

FIG. 7A is a partial cross-sectional view through line 7A/B of FIG. 6 illustrating an SSOI structure filled according to the processes illustrated in FIGS. 3A through 3E. In FIG. 7A, the fill of SSOI isolation 250 (see FIG. 6) is that of the second fill embodiment illustrated in FIGS. 1A through 1H and described supra. Additionally, for clarity, no liner 235 (see FIG. 5B) is illustrated, but is not precluded. In FIG. 7A, it can bee seen that MOS transistor 245 further includes source/drain (S/D) regions 280 on either side of a body region 285 and a gate dielectric 290 formed between gate electrode 270 and body region 285.

Figure 7B:
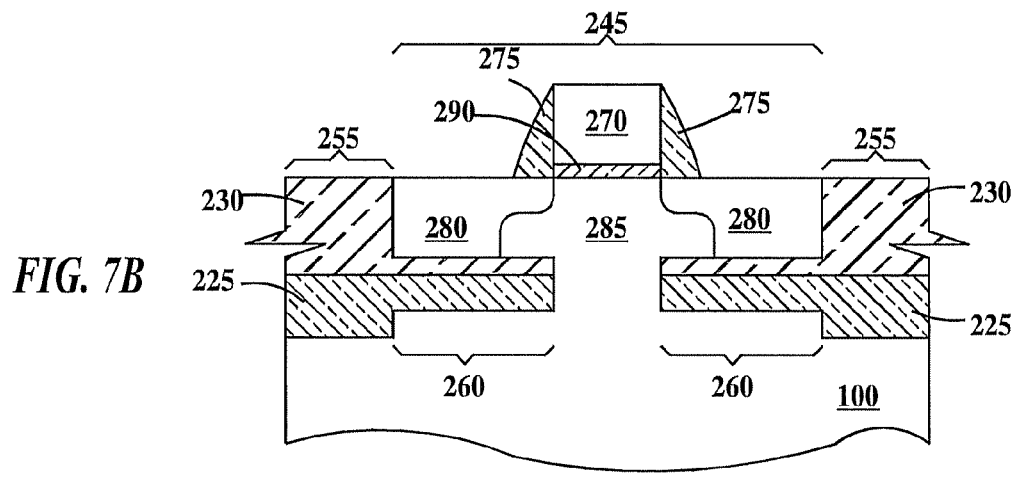
FIG. 7B is a partial cross-sectional view through line 7A/B of FIG. 6 illustrating an SSOI structure filled according to the processes illustrated in FIGS. 4A through 4C.

FIG. 7B is a partial cross-sectional view through line 6A/B of FIG. 6 illustrating an SSOI structure filled according to the processes illustrated in FIGS. 4A through 4C. In FIG. 7B, the fill of SSOI isolation 250 (see FIG. 6) is that of the first fill embodiment illustrated in FIGS. 2A through 2D and described supra. Additionally, for clarity, no liner 235 (see FIG. 5B) is illustrated, but is not precluded. In FIG. 7B, it can be seen that MOS transistor 245 further includes S/D regions 280 on either side of a body region 285 and a gate dielectric 290 formed between gate electrode 270 and body region 285.

Figure 8B:
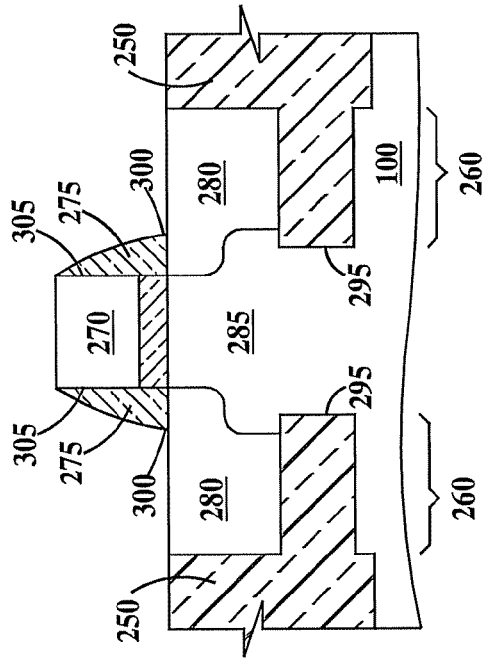
FIGS. 8A through 8D are partial cross-sectional views of alternative SSOI device structures.
Figure 8D:
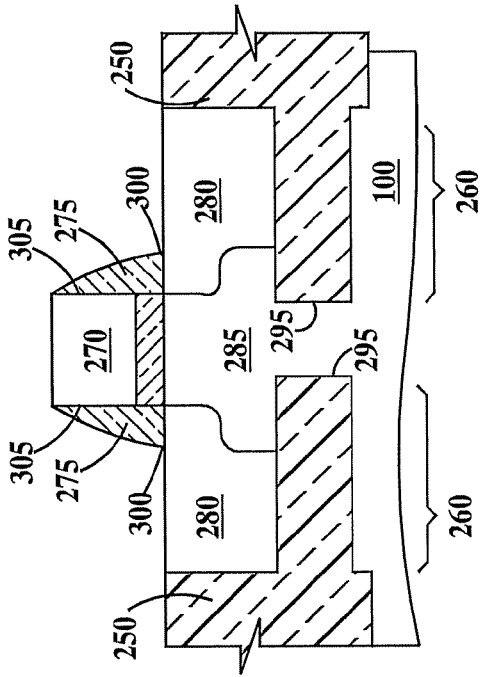
Figure 8A:
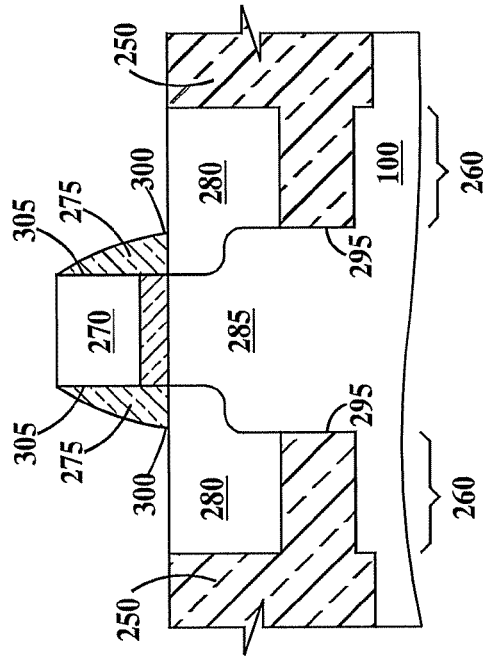
Figure 8C:
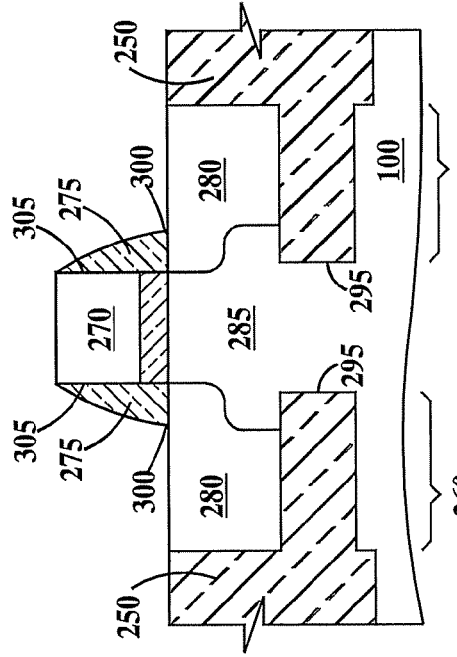

FIGS. 8A through 8B are partial cross-sectional views of alternative SSOI device structures. The primary difference between FIGS. 8A, 8B, 8C, and 8D is the alignment of the transistor gate to lateral portion 260 of SSOI isolation 250. In FIG. 8A, a sidewall 295 of lateral portion 260 of SSOI isolation 250 is aligned with an outer edge 300 of spacer 275. In FIG. 8B, sidewall 295 of lateral portion 260 of SSOI isolation 250 is aligned with between outer edge 300 of spacer 275 and a sidewall 305 of gate electrode 270. In FIG. 8C, a sidewall 295 of lateral portion 260 of SSOI isolation 250 is aligned with sidewall 305 of gate electrode 270. In FIG. 8D, sidewall 295 of lateral portion 260 of SSOI isolation 250 is aligned under gate electrode 270. In all four SSOI devices of FIGS. 8A, 8B, 8C, and 8D, lateral portion 260 of SSOI isolation 250 does not totally isolate body 285 from the rest of substrate 100. Thus, an electrical connection may be established between body 285 and substrate 100 to prevent or at least limit floating body effects while at the same time while still reducing short channel effects because lateral portion 260 of SSOI isolation 250 limits source/drain 280 junction area.

In FIGS. 8A through 8D, source/drains 280 are contacting lateral portion 260 of SSOI isolation 250. Thus, FIGS. 8A-8D illustrate fully depleted transistors. Standard, or non-depleted transistors, wherein source/drains 280 do not contact lateral portion 260 of SSOI isolation 250 may also be formed by control of the distance between the lateral portion and the top surface of the substrate.

Figure 9:
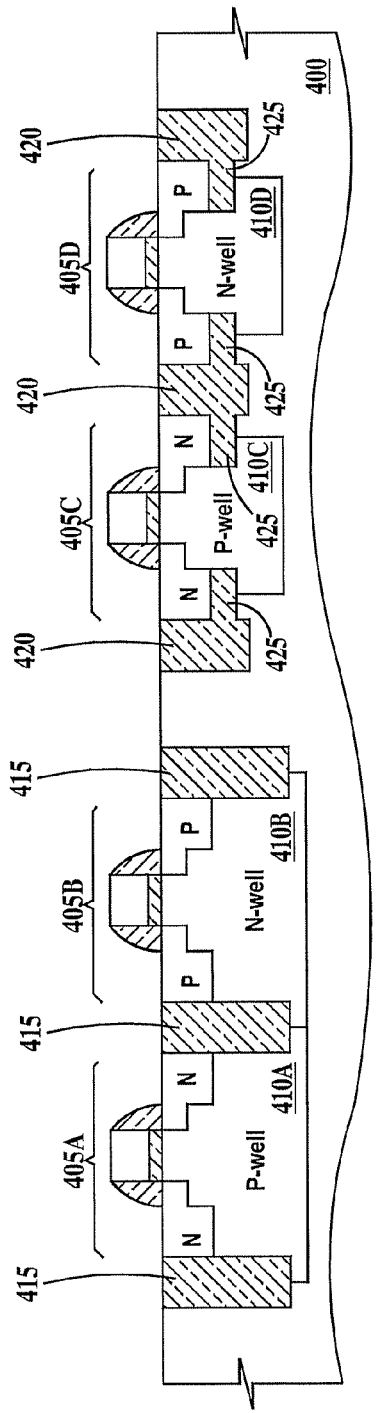
FIG. 9 is a partial cross-sectional view of an integrated circuit die having both bulk silicon devices and SSOI devices.

FIG. 9 is a partial cross-sectional view of an integrated circuit die having both bulk silicon devices and SSOI devices. In FIG. 9, an N-channel field effect transistor (NFET) device 405A is formed in a P-well 410A and a P-channel field effect transistor (PFET) 405B is formed in a N-well 410B. NFET 405A and PFET 405B are isolated from each other and other devices in substrate 400 by vertical trench isolation 415. P-well 410A and N-well 410B are aligned under and in contact with vertical trench isolation 415. P-well 410A and N-well 410B are bounded by vertical trench isolation 415 only in the vertical direction and physical and electrical contact exists between the N and P wells and substrate 400. Trench isolation 415 may be a dielectric material such as TEOS or HDP oxide. NFET 405A and PFET 405B are examples of conventional bulk silicon transistors.

Also, in FIG. 9, an NFET device 405C is formed in a P-well 410C and a PFET 405D is formed in a N-well 410D. P-well 410C and N-well 410D need only extend under lateral trench portions 425 of SSOI isolation 420. NFET 405C and PFET 405D are isolated from each other and other devices in substrate 400 by SSOI isolation 420 according to the present invention. P-well 410C and N-well 410D are aligned under and in contact with lateral trench portions 425 of SSOI isolation 420. P-well 410C and N-well 410D are only partially bounded by lateral trench portions 425, as physical and electrical contact exists between the N and P wells and substrate 400. NFET 405C and PFET 405D are examples of SSOI transistors.

Figure 10:
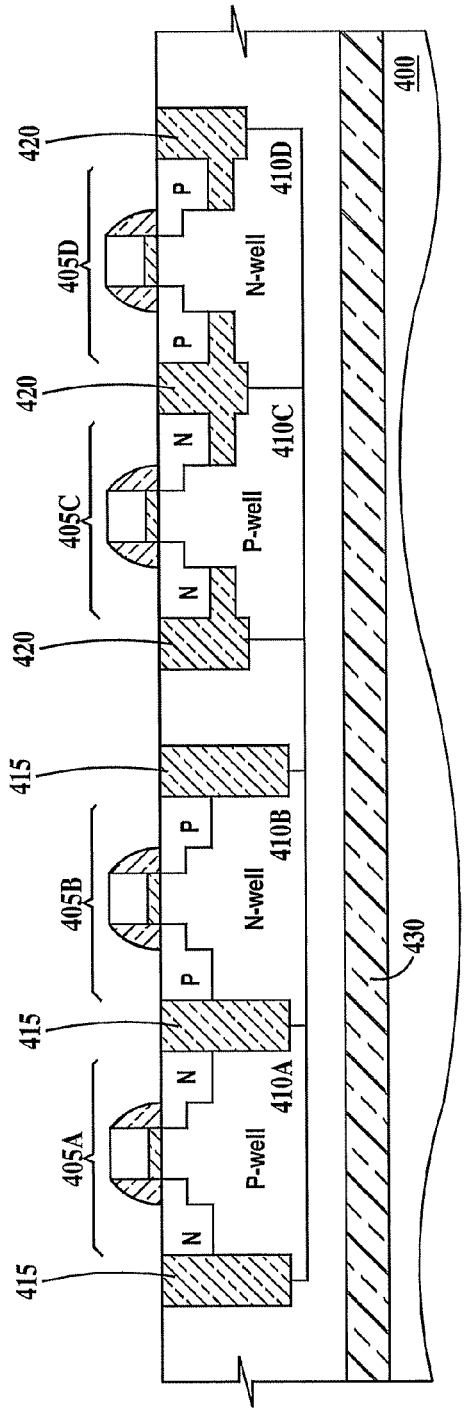
FIG. 10 is a partial cross-sectional view of an integrated circuit die having both bulk silicon devices and SSOI devices with in a SOI substrate.

FIG. 10 is a partial cross-sectional view of an integrated circuit die having both bulk silicon devices and SSOI devices with in an SOI substrate. The only difference between FIG. 10 and FIG. 9 is a buried oxide layer 430 of FIG. 10.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
a semiconductor substrate having a top surface;
a first region of said substrate having a first well extending into said semiconductor substrate from said top surface of said substrate and bounded in a direction perpendicular to said top surface by a first trench isolation, said first trench isolation extending perpendicular to said top surface of said substrate into said substrate, said first well abutting said semiconductor substrate;
a source and a drain of a first FET formed in said first well of said first region, said source and said drain abutting different sidewall regions of said first trench isolation;
a second region of said substrate having a second well extending into said semiconductor substrate from said top surface and bounded in a direction perpendicular to said top surface by a second trench isolation, said second trench isolation having a vertical portion extending perpendicular to said top surface into said substrate and a lateral portion extending from said vertical portion in a direction parallel to said top surface of said substrate, said second well abutting said semiconductor substrate; and
a source and a drain of a second FET formed in said well of said second region, said source of said second FET abutting a first region of said vertical portion and an abutting first region of said lateral portion, said drain of said second FET abutting a second region of said vertical portion and an abutting second region of said lateral portion, said source and said drain of said second FET intervening between said lateral portion and said top surface of said substrate.

2. The semiconductor device of claim 1, wherein a vertical edge of said lateral portion of said second trench isolation is aligned to an outer edge of a spacer formed on a sidewall of a gate electrode of said second FET.

3. The semiconductor device of claim 1 further including a buried oxide layer in said substrate below said first and second trench isolations.

4. The semiconductor device of claim 1, wherein said lateral portion of said second trench isolation has an upper region consisting of a first dielectric material and a lower region consisting of a second dielectric material, said first and second dielectric materials different from each other.

5. The semiconductor device of claim 4, wherein said first dielectric material is high-density plasma (DHP) oxide or spin-on-glass and said second dielectric material is tetraethoxysilane (TEOS) chemical-vapor-deposition (CVD) oxide or spin on glass.

6. The semiconductor device of claim 4, wherein said vertical portion of said second trench isolation is comprised of a third dielectric material, said third dielectric material different from said first or said second dielectric material, said first, second and third materials in separate layers.

7. The semiconductor device of claim 6, wherein said third dielectric material is high-density plasma (DHP) oxide.

8. The semiconductor device of claim 4, wherein said first dielectric material is high-density plasma (DHP) oxide and said second dielectric material is tetraethoxysilane (TEOS) chemical-vapor-deposition (CVD) oxide.

9. The semiconductor device of claim 4, wherein said vertical portion of said second trench isolation is comprised of a third dielectric material, said third dielectric material different from both said first and second dielectric material.

10. The semiconductor device of claim 1, further including:
a conformal dielectric liner formed on all surfaces of said second trench isolation that abut said substrate.

11. The semiconductor device of claim 10, wherein said liner is comprised of silicon dioxide or silicon nitride.

12. The semiconductor device of claim 1, wherein:
an upper region of said vertical portion of said second trench isolation is integral with an upper region of said lateral portion of said second trench isolation and is comprised of a first dielectric material,
a lower region of said vertical portion of said second trench isolation is integral with a lower region of said lateral portion of said second trench isolation and is comprised of a second dielectric material, said lower region of said lateral portion of said second trench isolation extending completely under said upper region of said lateral portion of said second trench isolation, and
said lower region of said vertical portion of said second trench isolation extends past said lateral portion of said second trench isolation into said substrate.

13. The semiconductor device of claim 1, wherein a vertical edge of said lateral portion of said second trench isolation is aligned between an outer edge of a spacer formed on a sidewall of a gate electrode of said second FET and an inner edge of said spacer abutting said sidewall of said gate electrode.

14. The semiconductor device of claim 1, wherein a vertical edge of said lateral portion of said second trench isolation is aligned to said sidewall of a gate electrode of said second FET.

15. The structure of claim 1, wherein said first well extends under said first trench isolation and said second well extends under said second trench isolation.

16. The structure of claim 1, wherein said first well extends under said first trench isolation and said second well extends under only said lateral portion of said second trench isolation.

17. The structure of claim 1, wherein a vertical edge of said lateral portion of said second trench isolation is aligned between two opposite sides of said gate electrode.

* * * * *